US011412629B2

(12) United States Patent
Hsu

(10) Patent No.: US 11,412,629 B2
(45) Date of Patent: Aug. 9, 2022

(54) HINGE DEVICE

(71) Applicant: FOSITEK CORPORATION, New Taipei (TW)

(72) Inventor: An-Szu Hsu, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 17/160,823

(22) Filed: Jan. 28, 2021

(65) Prior Publication Data

US 2022/0141981 A1    May 5, 2022

(30) Foreign Application Priority Data

Nov. 4, 2020  (TW) .................................. 109138373

(51) Int. Cl.
*E05D 3/06* (2006.01)
*H05K 5/02* (2006.01)
(Continued)

(52) U.S. Cl.
CPC ............ *H05K 5/0226* (2013.01); *F16C 11/04* (2013.01); *E05D 3/06* (2013.01); *E05D 11/087* (2013.01);
(Continued)

(58) Field of Classification Search
CPC ...... G06F 1/168; G06F 1/1681; G06F 1/1616; G06F 1/547; E05Y 2900/602; E05Y 2900/606; E05Y 2800/205; E05Y 2800/20; E05Y 2800/242; E05Y 2201/218; E05Y 2201/232; H04M 1/022; H04M 1/0214; H04M 1/0216; H05D 5/0226; E05D 3/12; E05D 3/122; E05D 3/14; E05D 3/16; E05D 3/06; E05D 11/06; E05D 11/087; E05D 11/105; E05D 1/00; E05D 1/02; E05D 1/04; E05D 7/00; F16C 11/04; F16C 11/12
See application file for complete search history.

(56) References Cited

U.S. PATENT DOCUMENTS 10,423,019 B1 *  9/2019  Song ..................... G06F 1/1681
10,480,225 B1 * 11/2019  Hsu .......................... E05D 3/12
(Continued)

FOREIGN PATENT DOCUMENTS

CN          108322567 A      7/2018

OTHER PUBLICATIONS

Taiwanese Search Report for Taiwanese Application No. 109138373, dated Jan. 7, 2022, with English translation.

*Primary Examiner* — Chuck Y Mah
(74) *Attorney, Agent, or Firm* — Birch, Stewart, Kolasch & Birch, LLP

(57) ABSTRACT

A hinge device is adapted to be installed between two machine bodies that are mounted with a flexible display. The hinge device includes a base member, two rotating modules mounted respectively to opposite sides of the base member and adapted for the machine bodies to be mounted respectively thereto, and a central support plate disposed above the base member and connected between the rotating modules. The central support plate is drivable by the rotating modules to move relative to the base member from a supporting position, where the flexible display is flat and is supported thereby from below, to a receding position, where a display receiving space is provided for receiving a bent portion of the flexible display.

9 Claims, 12 Drawing Sheets

(51) Int. Cl.
*F16C 11/04* (2006.01)
*E05D 11/08* (2006.01)
*E05D 11/10* (2006.01)

(52) U.S. Cl.
CPC ....... *E05D 11/105* (2013.01); *E05Y 2201/218* (2013.01); *E05Y 2201/232* (2013.01); *E05Y 2900/606* (2013.01)

(56) References Cited

U.S. PATENT DOCUMENTS

| | | | |
|---|---|---|---|
| 10,761,573 B2 * | 9/2020 | Hsu | G06F 1/1681 |
| 10,824,197 B1 * | 11/2020 | Hsu | G06F 1/1641 |
| 2015/0366089 A1 * | 12/2015 | Park | H04M 1/0268 |
| | | | 361/679.01 |
| 2017/0264723 A1 * | 9/2017 | Mok | H04M 1/0268 |
| 2019/0174645 A1 * | 6/2019 | Jeon | G09F 9/301 |
| 2019/0179373 A1 * | 6/2019 | Cheng | H04M 1/02 |
| 2020/0097051 A1 * | 3/2020 | Liu | G06F 1/1652 |
| 2020/0371553 A1 * | 11/2020 | Hsu | G06F 1/1624 |
| 2021/0044682 A1 * | 2/2021 | Liu | H04M 1/0268 |
| 2021/0067614 A1 * | 3/2021 | Cheng | G06F 1/1681 |
| 2021/0271294 A1 * | 9/2021 | Liao | H04M 1/0216 |
| 2021/0365078 A1 * | 11/2021 | Chen | E05D 11/10 |

* cited by examiner

HINGE DEVICE

CROSS-REFERENCE TO RELATED APPLICATION

This application claims priority of Taiwanese Patent Application No. 109138373, filed on Nov. 4, 2020.

FIELD

The disclosure relates to a hinge device, more particularly to a hinge device adapted to be installed between two machine bodies that are mounted with a flexible display.

BACKGROUND

In the past few years, flexible displays have been widely used in various foldable devices. These foldable devices can be divided into two groups: inward-folding devices and outward-folding devices. When the flexible displays are used in the inward-folding devices, bent portions of the flexible displays are often cramped in limited spaces when the devices are folded, and thus are easily damaged.

SUMMARY

Therefore, the object of the disclosure is to provide a hinge device that can alleviate the drawback of the prior art.

According to the disclosure, a hinge device is adapted to be installed between two machine bodies that are mounted with a flexible display. The hinge device includes a base member, two rotating modules and a central support plate.

The base member extends in a front-rear direction. The rotating modules are mounted respectively to opposite sides of the base member in a left-right direction, and are adapted for the machine bodies to be mounted respectively thereto. The rotating modules are convertible relative to the base member between an open position, where the machine bodies are in an unfolded state such that the flexible display is flat, and a closed position, where the machine bodies are in a folded state such that the flexible display is folded. The central support plate extends in the front-rear direction, is disposed above the base member in an up-down direction, and is connected between the rotating modules. The central support plate is drivable by the rotating modules to move relative to the base member in the up-down direction from a supporting position, where the rotating modules are at the open position, and where the central support plate is adapted to support the flexible display from below, to a receding position, where the rotating modules are at the closed position, and where is disposed under the supporting position to provide a display receiving space disposed directly and immediately above the central support plate 3 for receiving a bent portion of the flexible display.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
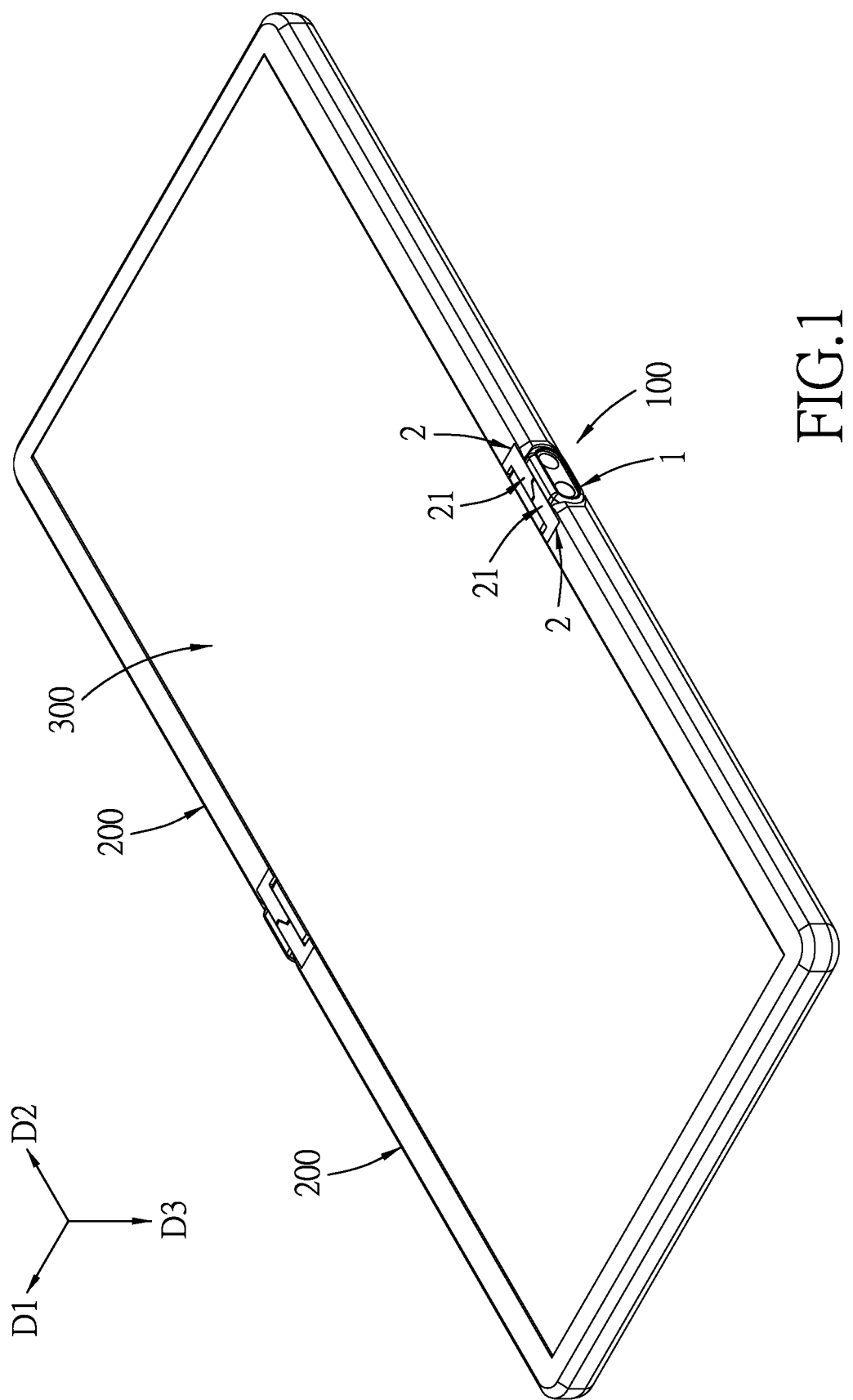
FIG. 1 is a perspective view of an embodiment of a hinge device according to the disclosure installed between two machine bodies that are mounted with a flexible display, illustrating two rotating modules of the embodiment at an open position and the machine bodies in an unfolded state.
Figure 2:
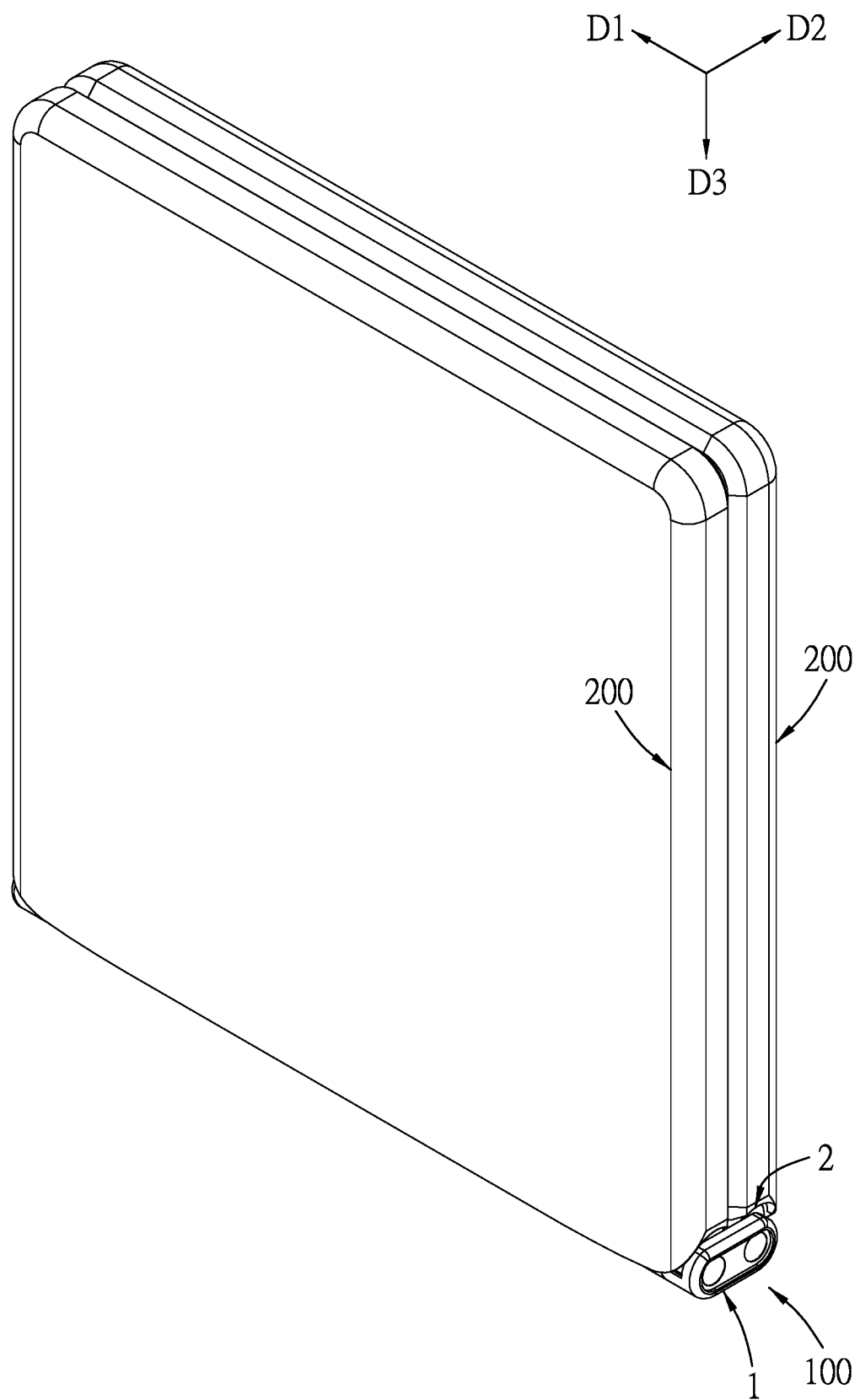
FIG. 2 is a perspective view similar to FIG. 1, illustrating the rotating modules at a closed position and the machine bodies in a folded state.
Figure 3:
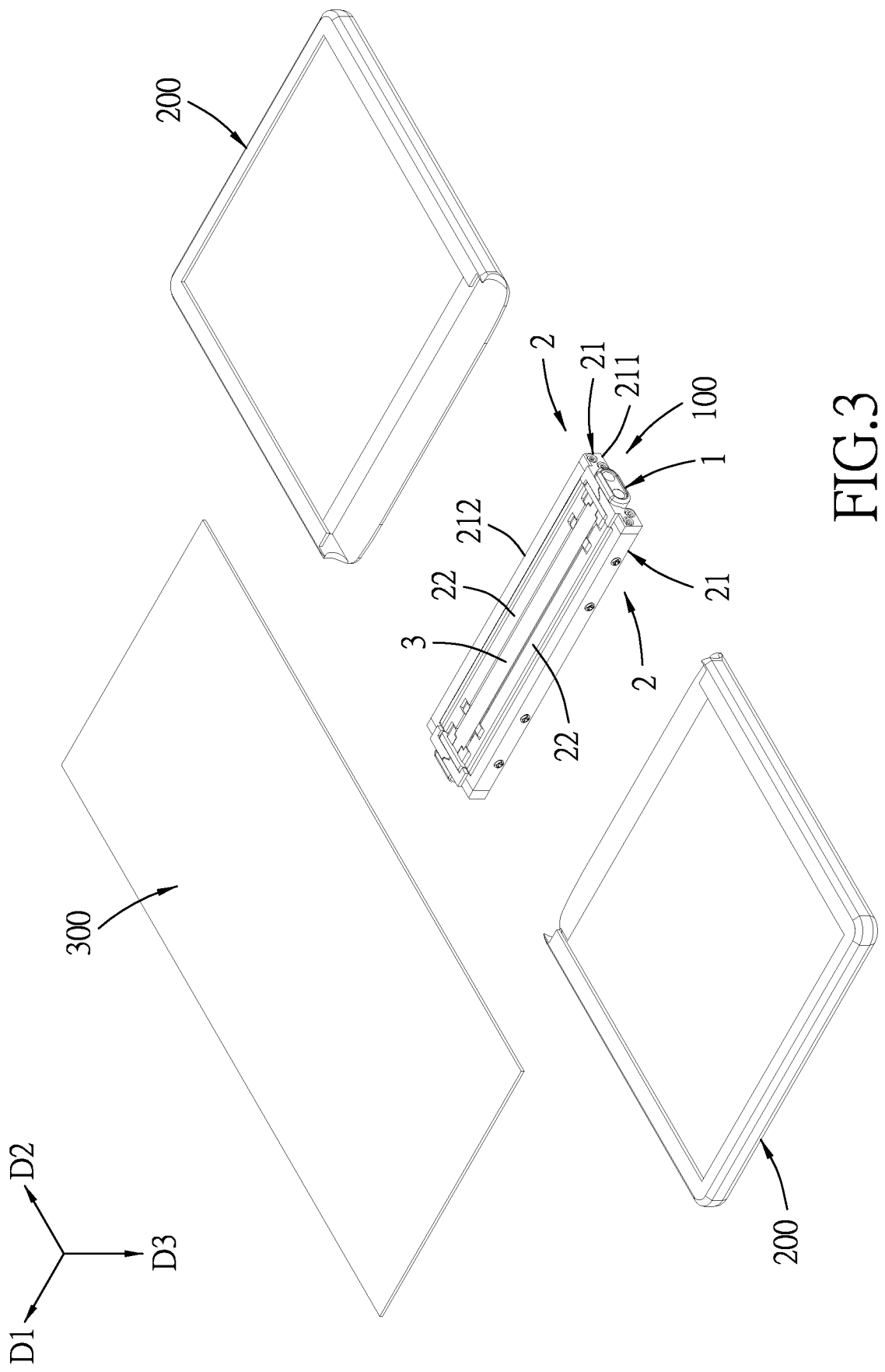
FIG. 3 is a partly exploded perspective view of FIG. 1.

Referring to FIGS. 1 to 4, an embodiment of a hinge device 100 according to the disclosure is adapted to be installed between two machine bodies 200 that are mounted with a flexible display 300 so as to form a foldable device. It should be noted that, in the present embodiment, the flexible display 300 is mounted to the machine bodies 200 but not to the hinge device 100, that is, the hinge device 100 only provides support to the flexible display 300, but is not limited thereto.

The hinge device 100 includes a base member 1, two rotating modules 2, a central support plate 3 and two synchronizing pieces 4. It should also be noted that, in other embodiments of the disclosure, the synchronizing pieces 4 may be omitted.

The base member 1 extends in a front-rear direction (D1), and has a plurality of arc-shaped sliding grooves 11 and two first connecting slots 12. The first connecting slots 12 are opposite to each other in the front-rear direction (D1).

Figure 5:
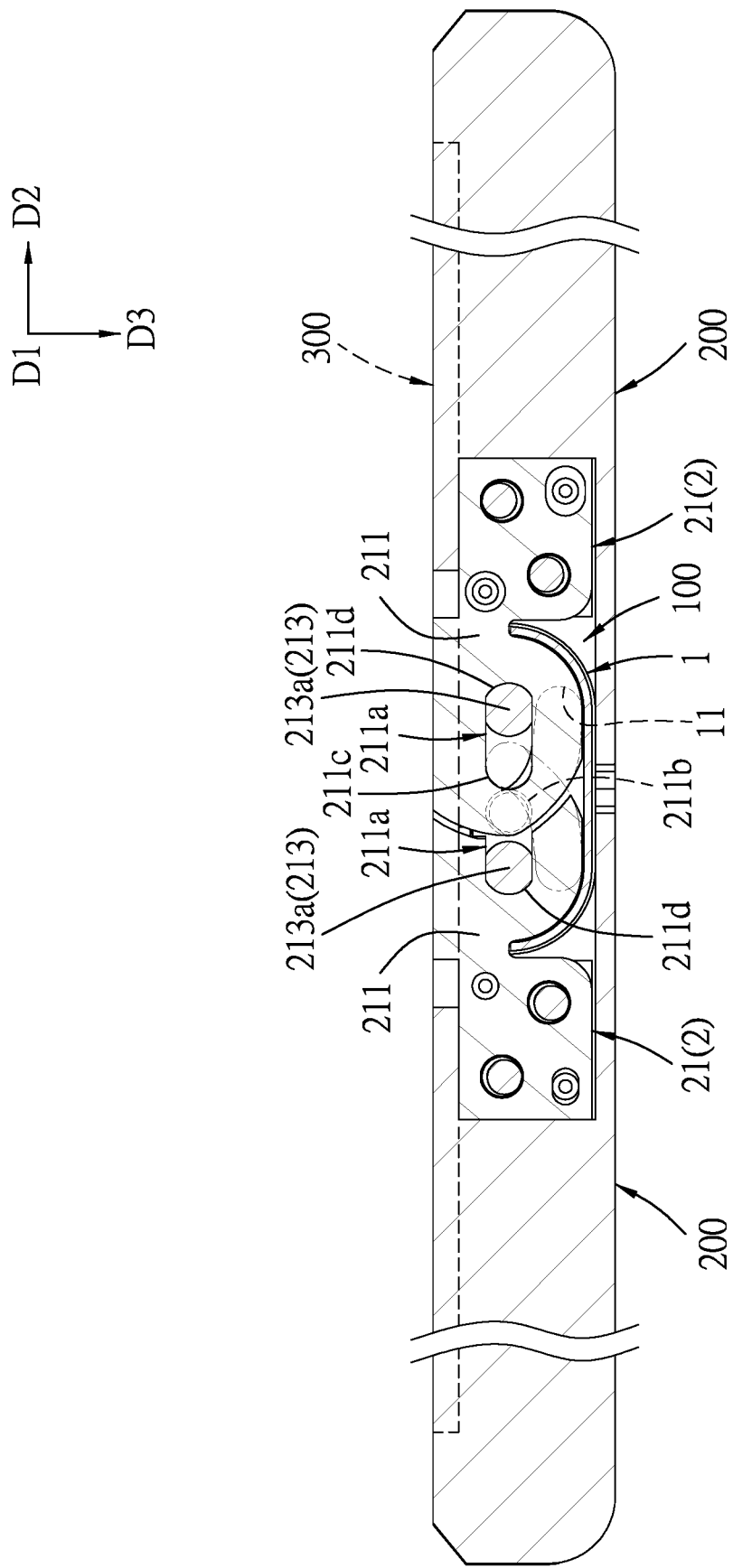
FIG. 5 is a fragmentary sectional view of the embodiment, the machine bodies and the flexible display, illustrating the rotating modules at the open position.
Figure 6:
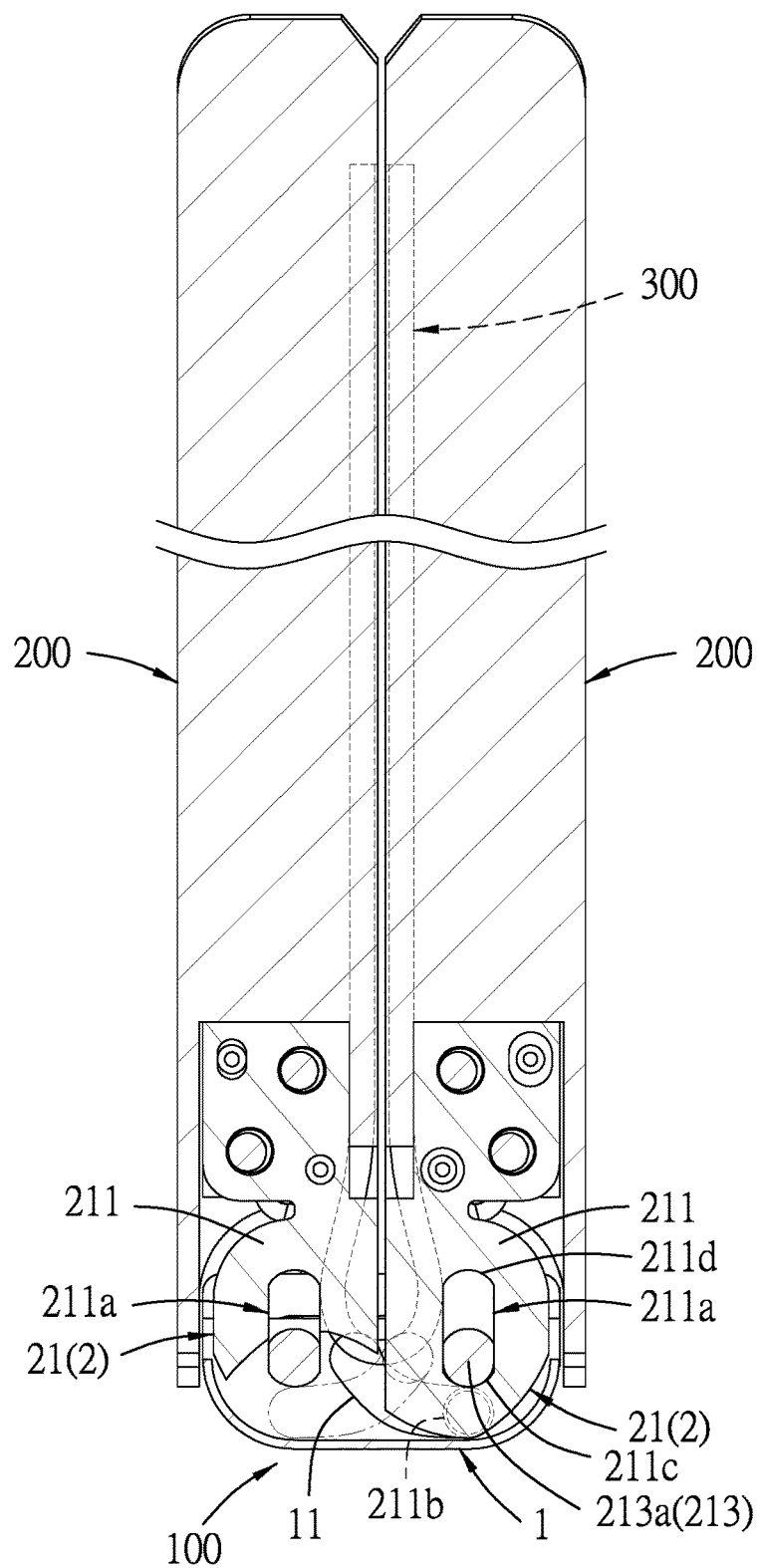
FIG. 6 is a fragmentary sectional view of the embodiment, the machine bodies and the flexible display, illustrating the rotating modules at the closed position.

The rotating modules 2 are mounted respectively to opposite sides of the base member 1 in a left-right direction (D2), and are adapted for the machine bodies 200 to be mounted respectively thereto. The rotating modules 2 are convertible relative to the base member 1 between an open position (see FIG. 5) and a closed position (see FIG. 6).

When the rotating modules 2 are at the open position, the machine bodies 200 are in an unfolded state (see FIG. 5) such that the flexible display 300 is flat. When the rotating modules 2 are at the closed position, the machine bodies 200 are in a folded state (see FIG. 6) such that the flexible display 300 is folded.

Each of the rotating modules 2 includes a moving frame 21 and a side support plate 22. For each of the rotating modules 2, the moving frame 21 is movable relative to the base member 1, and is adapted for a respective one of the machine bodies 200 to be mounted thereto, and the side support plate 22 is connected between the moving frame 21 and the base member 1, and is drivable by the moving frame 21 to rotate relative to the base member 1 about a plate rotational axis (A1).

Referring to FIGS. 3 to 6, specifically, the moving frame 21 of each of the rotating modules 2 has two moving segments 211, a connecting segment 212 and two shaft members 213. Since the two rotating modules 2 are identical to each other, for the sake of brevity, the following structural description of the moving frame 21 only refers to one of the rotating modules 2.

The moving segments 211 of the moving frame 21 are respectively connected to opposite ends of the base member 1 in the front-rear direction (D1), and are movable relative to the base member 1. The side support plate 22 is disposed between the moving segments 211 of the moving frame 21 and is connected to the connecting segment 212 of the moving frame 21.

Each of the moving segments 211 has a slide slot 211a and a sliding pole 211b. The slide slot 211a of each of the moving segments 211 extends therethrough in the front-rear direction (D1), is elongated in the left-right direction (D2) (see FIGS. 4 and 5), and has an inner end 211c and an outer end 211d that are opposite to each other in the left-right direction (D2). The sliding pole 211b of each of the moving segments 211 extends in the front-rear direction (D1), and is slidably received in a respective one of the arc-shaped sliding grooves 11 of the base member 1.

The connecting segment 212 of the moving frame 21 extends in the front-rear direction (D1), and is connected between the moving segments 211.

Each of the shaft members 213 of the moving frame 21 extends in the front-rear direction (D1), extends movably through the slide slot 211a of a respective one of the moving segments 211 and into a respective one of the opposite ends of the base member 1, and is connected to the central support plate 3. Each of the shaft members 213 is drivable by the respective one of the moving segments 211 to rotate relative to the base member 1 about a shaft rotational axis (A2) extending in the front-rear direction (D1).

Specifically, each of the shaft members 213 has a sliding portion 213a and a driving block 213b. The sliding portion 213a of each of the shaft members 213 is slidably and non-rotatably received in the slide slot 211a of the respective one of the moving segments 211. The driving block 213b of each of the shaft members 213 is sleeved on an end segment of the sliding portion 213a and has a driving protrusion 213c that extends in the front-rear direction (D1) and that is spaced apart form the shaft rotational axis (A2).

When each of the rotating modules 2 is at the open position, the sliding portion 213a of each of the shaft members 213 is disposed in the outer end 211d of the slide slot 211a of the respective one of the moving segments 211. When each of the rotating modules 2 is at the closed position, the sliding portion 213a of each of the shaft members 213 is disposed in the inner end 211c of the slide slots 211a of the respective one of the moving segments 211. In such a manner, when the rotating modules 2 are converted from the open position to the closed position (i.e., the machine bodies 200 are converted from the unfolded state to the folded state), the moving frame 21 of each of the rotating modules 2 rotates relative to the base member 1, and slides slightly out of the base member 1 as each of the shaft members 213 moves from the outer end 211d of the slide slot 211a to the inner end 211c.

It should be noted that, the above-mentioned movement of each of the rotating modules 2, which involves sliding movement and rotation, is a resulting combination of movements of the sliding portions 213a of the shaft members 213 relative to the slide slots 211a of the moving segments 211 and movements of the sliding poles 211b of the moving segments 211 relative to the arc-shaped sliding grooves 11 of the base member 1. That is, configurations of the above-mentioned components (e.g., an extending pattern of the arc-shaped sliding grooves 11 that corresponds to the movements of the sliding poles 211b) are particularly designed in order to enable the sliding-rotating movement of the rotating modules 2. However, the above-mentioned configurations are not limited to the present embodiment and may be adjusted in other embodiments depending on actual requirements.

Figure 4:
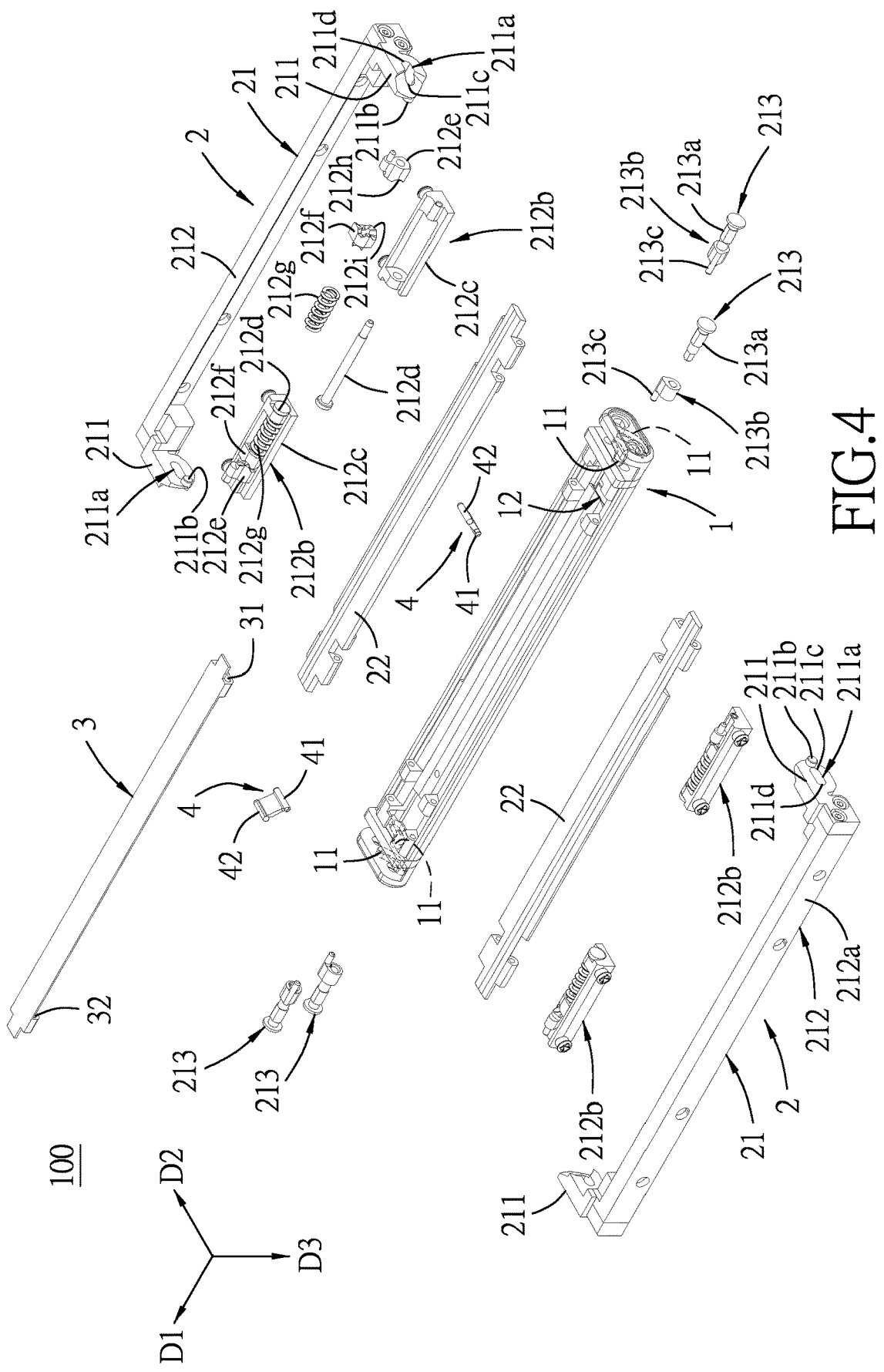
FIG. 4 is an exploded perspective view of the embodiment.
Figure 7:
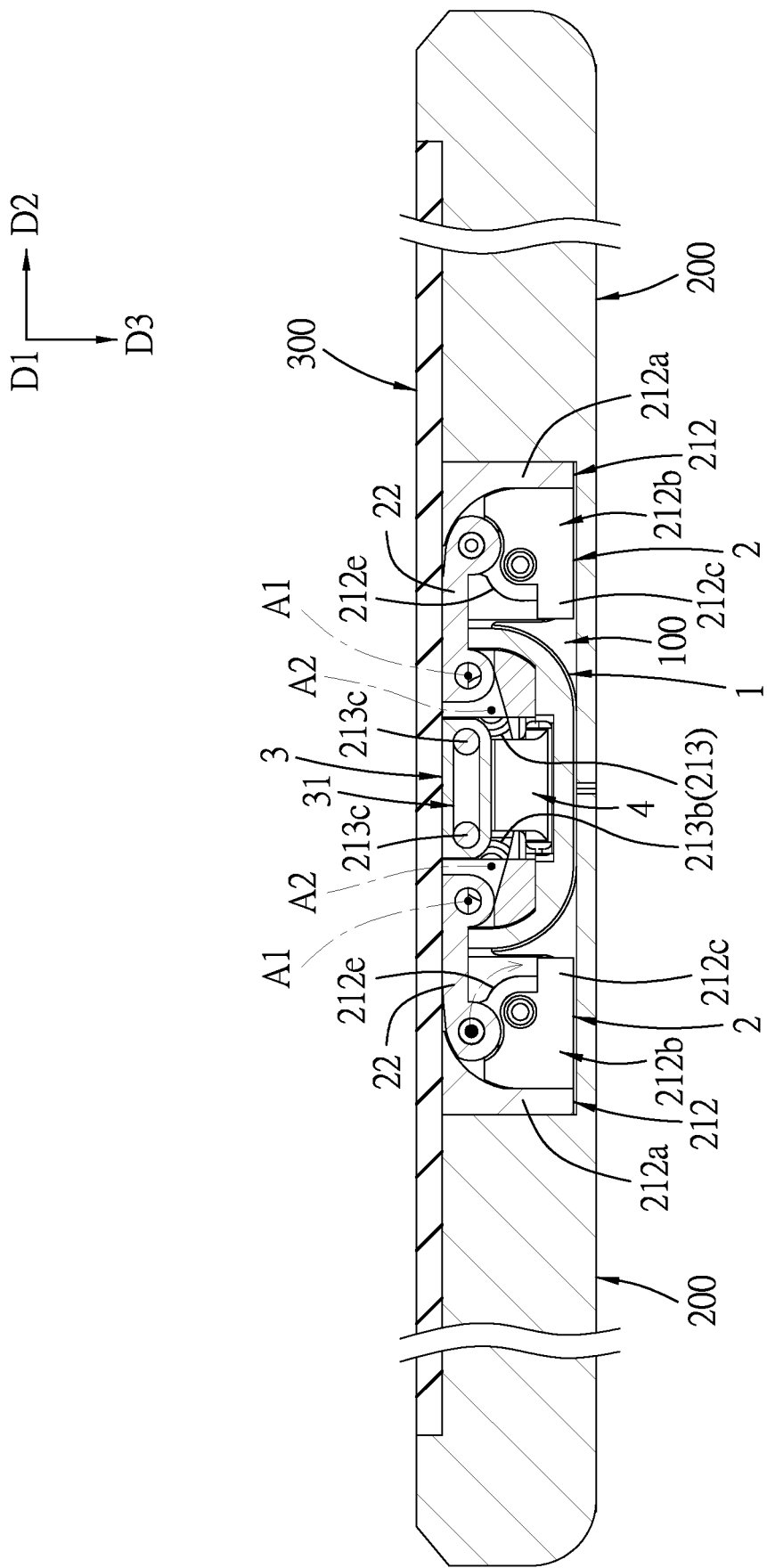
FIG. 7 is a fragmentary sectional view of the embodiment, the machine bodies and the flexible display, illustrating a side support plate of each of the rotating modules cooperating with a central support plate to support the flexible display when the rotating modules are at the open position.
Figure 8:
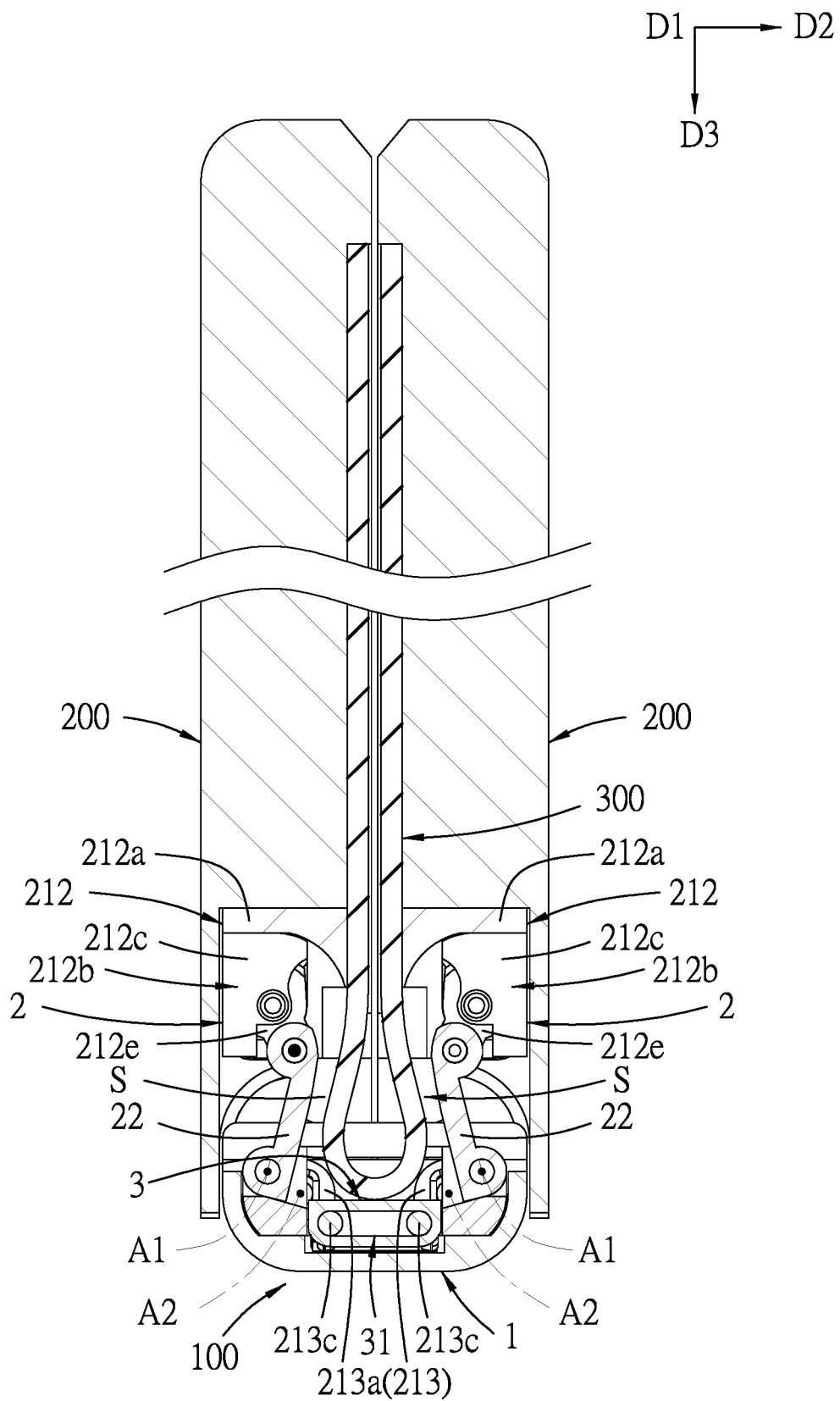
FIG. 8 is a fragmentary sectional view of the embodiment, the machine bodies and the flexible display, illustrating the side support plate of each of the rotating modules cooperating with the central support plate to provide a space for receiving a bent portion of the flexible display when the rotating modules are at the closed position.

Referring to FIGS. 4, 7 and 8, the central support plate 3 extends in the front-rear direction (D1), is disposed above the base member 1 in an up-down direction (D3), and is connected between the rotating modules 2.

Specifically on the position of the central support plate 3, the first connecting slots 12 of the base member 1 are disposed respectively proximate to two ends of the central support plate 3 that are opposite to each other in the front-rear direction (D1). The side support plates 22 of the rotating modules 2 are disposed respectively on opposite sides of the central support plate 3 in the left-right direction (D2). The driving protrusion 213c of each of the shaft members 213 is disposed at a respective one of the two ends of the central support plate 3 in a manner that the driving protrusions 213c which are disposed at each of the two ends of the central support plate 3 are aligned with each other in the left-right direction (D2).

The central support plate 3 has a plurality of receiving grooves 31, each of which is disposed proximate to one of the two ends of the central support plate 3, and two second connecting slots 32 which are disposed respectively proximate to the two ends of the central support plate 3.

The driving protrusion 213c of each of the shaft members 213 is engaged movably with a corresponding one of the receiving grooves 31 such that, during rotation of each of the shaft members 213 relative to the base member 1, the driving protrusion 213c drives the central support plate 3 to move relative to the base member 1 in the up-down direction (D3) between a supporting position (see FIG. 7) and a receding position (see FIG. 8).

When the central support plate 3 is at the supporting position, the rotating modules 2 are at the open position, and the central support plate 3 is adapted to cooperate with the side support plates 22 to support the flexible display 300 from below.

When the central support plate 3 is at the receding position, the rotating modules 2 are at the closed position, and the central support plate 3 is disposed under the supporting position to provide a display receiving space (S) disposed directly and immediately above the central support plate 3 for receiving a bent portion of the flexible display 300. Specifically, the display receiving space (S) is cooperatively defined by the side support plates 22 of the rotating modules 2 and the central support plate 3.

It should be noted that, as mentioned above, when the rotating modules 2 are converted from the open position to the closed position, the moving frames 21 of the rotating modules 2 slide slightly out of the base member 1. In such a manner, the move frames 21 bring portions of the folded flexible display 300 to move slightly away from the base member 1. As such, movements of the moving frames 21 and the presence of the display receiving space (S) cooperatively prevent the bent portion of the flexible display 300 from being cramped by any nearby components.

It should also be noted that, referring to FIG. 8, a distance between the plate rotational axes (A1) of the side support plates 22 of the rotating modules 2 is greater than a distance between the shaft rotational axes (A2) of the shaft members 213 of the rotating modules 2. As such, when the rotating modules 2 are at the closed position, a width of the display receiving space (S) in the left-right direction (D2) increases downwardly.

In other embodiments of the disclosure, the side support plate 22 of each of the rotating modules 2 may be integrally formed with the moving frame 21 as a single driving component (i.e., the side support plates 22 may be omitted). In these cases, the central support plate 3 is movable between the supporting and receding positions by said driving component.

Figure 9:
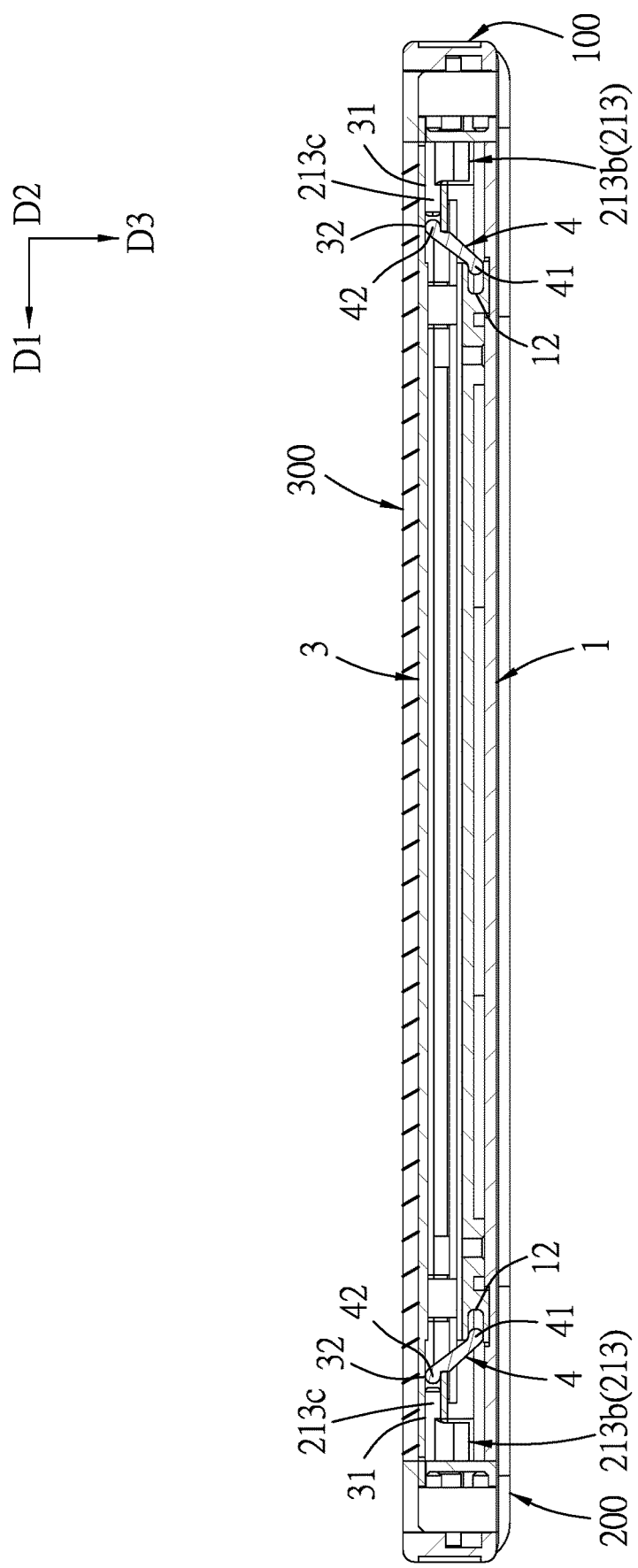
FIG. 9 is a fragmentary sectional view of the embodiment, the machine bodies and the flexible display, illustrating connections between the central support plate and two synchronizing pieces of the embodiment when the rotating modules are at the open position.
Figure 10:
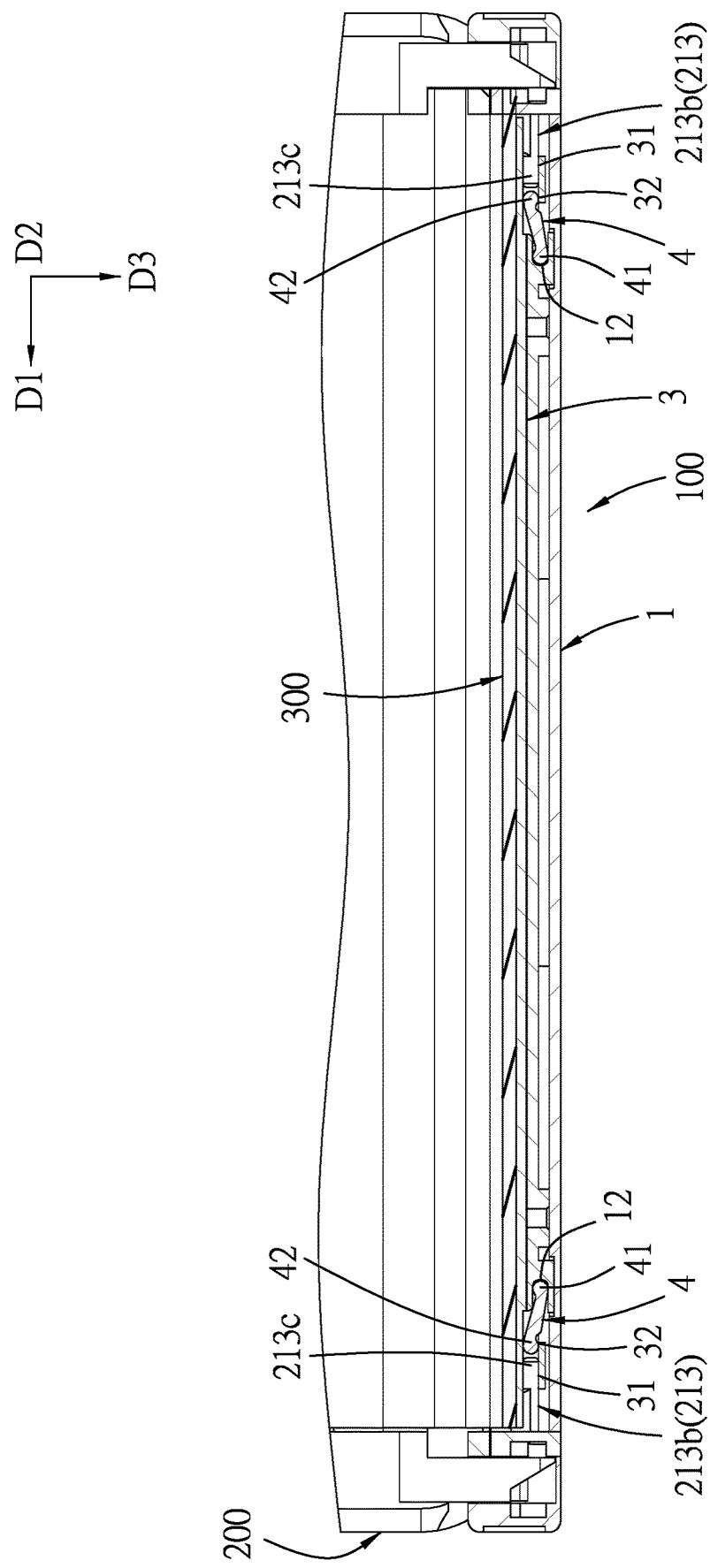
FIG. 10 is a fragmentary sectional view of the embodiment, the machine bodies and the flexible display, illustrating the connections between the central support plate and the two synchronizing pieces when the rotating modules are at the closed position.
Figure 11:
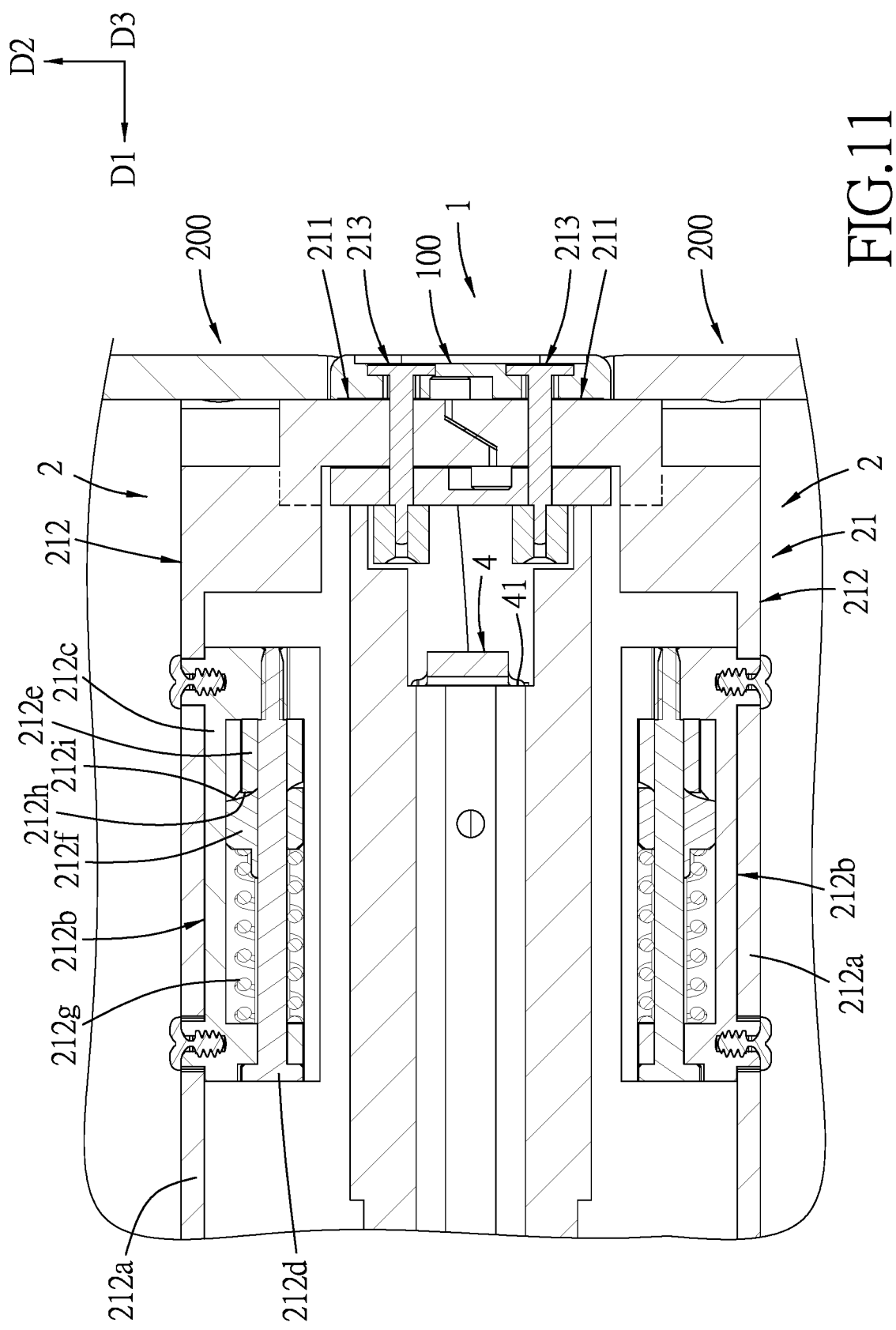
FIG. 11 is a fragmentary sectional view, illustrating a torsion unit of each of the rotating modules when the rotating modules are at the open position.
Figure 12:
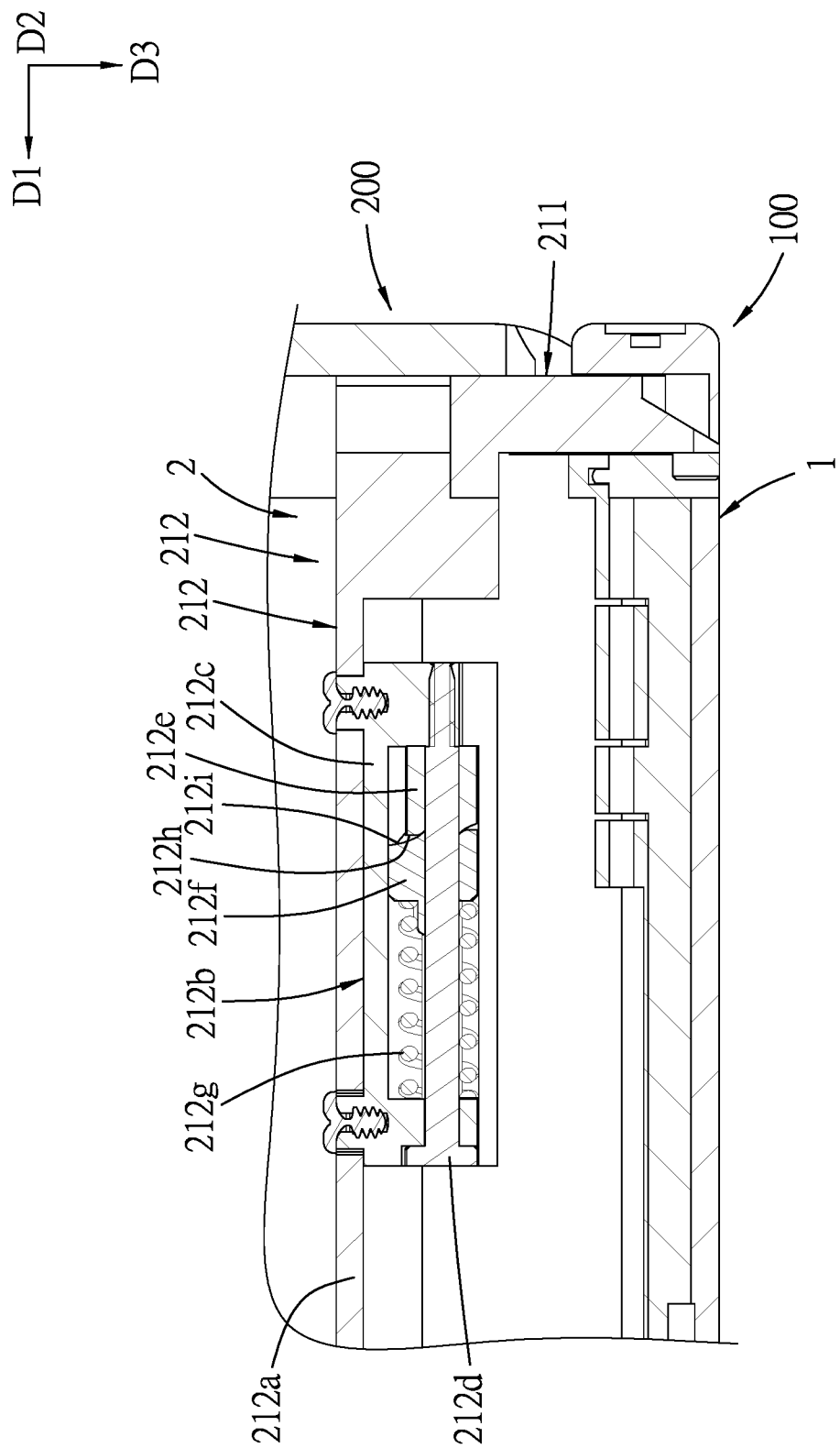
FIG. 12 is a fragmentary sectional view, illustrating the torsion unit of one of the rotating modules when the rotating modules are at the closed position.

Referring to FIGS. 4, 9 and 10, the synchronizing pieces 4 are arranged in the front-rear direction (D1), and are disposed respectively proximate to the opposite ends of the central support plate 3. Each of the synchronizing pieces 4 has a first connecting portion and a second connecting portion 42 that are respectively connected to opposite ends of a thin plate-shaped main portion of each of the synchronizing pieces 4.

The first connecting portion 41 of each of the synchronizing pieces 4 is pin-shaped, extends in the left-right direction (D2), and is received in a respective one of the first connecting slots 12 of the base member 1. The second connecting portion 42 of each of the synchronizing pieces 4 is pin-shaped, extends in the left-right direction (D2), is opposite to the first connecting portion 41 in a direction oblique to the front-rear direction (D1), and is received in a respective one of the second connecting slots 32 of the central support plate 3 such that each of the synchronizing pieces 4 is connected between the central support plate 3 and the base member 1.

It should be noted that each of the synchronizing pieces 4 is slidable in one of the first and second connecting slots 12, 32 in the front-rear direction (D1). In the present embodiment, each of the synchronizing pieces 4 is slidable in a respective one of the first and second connecting slots 12, and each of receiving grooves 31 is in spatial communication with a corresponding one of the second connecting slots 32, but is not limited thereto.

By virtue of the connection between the second connecting portion 42 of each of the synchronizing pieces 4 and the central support plate 3, the two ends of the central support plate 3 are maintained constantly at the same level with respect to the base member 1 (i.e., whether the central support plate 3 is in motion or remains stationary), and the driving protrusions 213c of the shaft members 213, which are disposed at the two ends of the central support plate 3, are thereby maintained at the same level as well. In other words, the rotations of the shaft members 213 are synchronized by the synchronizing pieces 4 and the central support plate 3 and, as a result, the converting movements of the rotating modules 2 between the open and closed positions are also synchronized.

Referring to FIGS. 4, 5, 11 and 12, it should be further noted that, the connecting segment 212 of the moving frame 21 of each of the rotating modules 2 has a maintaining mechanism that maintains each of the rotating modules 2 at at least one predetermined position. In the present embodiment, there are two predetermined positions, which are the open position and the closed position. However, in variations of the embodiment, there might be one, three, or more than three predetermined positions, and the predetermined positions may or may not include any of the open and closed positions.

Specifically on the maintaining mechanism, the connecting segment 212 of the moving frame 21 of each of the rotating modules 2 has a connecting main body 212a and two torsion units 212b.

The connecting main body 212a of each of the rotating modules 2 is connected between the moving segments 211 of the moving frame 21. The torsion units 212b of each of the rotating modules 2 are spaced apart from each other, are mounted to the connecting main body 212a, and are connected to the side support plate 22 of a corresponding one of the rotating modules 2. However, in variations of the embodiment, the connecting segment 212 of each of the rotating modules 2 may have only one torsion unit 212b, or the torsion unit 212b may be omitted. In the latter case, the connecting main body 212a is connected directly to the side support plate 22 of the corresponding one of the rotating modules 2.

Each of the torsion units 212b has a housing 212c, a pin member 212d, a driven member 212e, a pressing piece 212f and a resilient member 212g.

The housing 212c of each of the torsion units 212b is mounted to the connecting main body 212a. The pin member 212d of each of the torsion units 212b extends fixedly through the housing 212c. The driven member 212e of each of the torsion units 212b is rotatably sleeved on the pin member 212d, and is partially received in the housing 212c with a portion thereof extending out of the housing 212c and connected to the side support plate 22, such that the driven member 212e is co-rotatable with the side support plate 22 relative to the housing 212c about a central axis of the pin member 212d which extends in the front-rear direction (D1).

The pressing piece 212f of each of the torsion units 212b is received non-rotatably in the housing 212c, is slidably sleeved on the pin member 212d, is slidable relative to the housing 212c in the front-rear direction (D1), and is disposed adjacent to the driven member 212e in the front-rear direction (D1).

For each of the torsion units 212b, the driven member 212e has a first concave-convex structure 212h, and the pressing piece 212f has a second concave-convex structure 212i. The first and second concave-convex structure 212h, 212i face toward each other.

The resilient member 212g of each of the torsion units 212b is received in the housing 212c, is sleeved on the pin member 212d with opposite ends thereof abutting respectively against an inner surface of the housing 212c and the pressing piece 212f, such that the resilient member 212g biases the pressing piece 212f to contact the driven member 212e for maintaining contact between the first and second concave-convex structures 212h, 212i.

When the rotating modules 2 are at one of the predetermined positions (i.e., the open position or the closed position), the first and second concave-convex structures 212h, 212*i* of each of the rotating modules 2 are complementary in shape with each other (i.e., the first and second concave-convex structures 212*h*, 212*i* are engaged with each other), so as to maintain the rotating modules 2 at the one of the predetermined positions. That is, the rotating modules 2 at the one of the predetermined positions are maintained stationary.

When the rotating modules 2 are moved away from the one of the predetermined positions, rotation of the driven member 212*e* relative to the pressing piece 212*f* causes the first concave-convex structure 212*h* to move relative to the second concave-convex structure 212*i* and pushes the same away (at this moment, the first and second concave-convex structures 212*h*, 212*i* are not engaged with each other). As such, the pressing piece 212*f* moves away from the driven member 212*e* and presses the resilient member 212*g* against the inner surface of the housing 212*c*. By virtue of the resilient member 212*g*, the pressing piece 212*f* is disposed to push constantly against the driven member 212*e*, and thus the rotating modules 2 at any position other than the predetermined positions are inclined to move toward one of the predetermined positions. In other words, the first and second concave-convex structures 212*h*, 212*i* are disposed to be engaged with each other, and the rotating modules 2 are disposed to be maintained at one of the predetermined positions.

In summary, by virtue of the configurations of the rotating modules 2 of the hinge device 100, the central support plate 3 of the hinge device 100 is movable from the supporting position to the receding position so as to provide the display receiving space (S) for the bent portion of the flexible display 300, which prevents the bent portion of the flexible display 300 from being cramped and damaged by any surrounding components.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A hinge device adapted to be installed between two machine bodies that are mounted with a flexible display, said hinge device comprising:
    a base member that extends in a front-rear direction;
    two rotating modules that are mounted respectively to opposite sides of said base member in a left-right direction, and that are adapted for the machine bodies to be mounted respectively thereto, said rotating modules being convertible relative to said base member between an open position, where the machine bodies are in an unfolded state such that the flexible display is flat, and a closed position, where the machine bodies are in a folded state such that the flexible display is folded;
    a central support plate that extends in the front-rear direction, that is disposed above the base member in an up-down direction, and that is connected between said rotating modules, said central support plate being drivable by said rotating modules to move relative to said base member in the up-down direction from
        a supporting position, where said rotating modules are at the open position, and where said central support plate is adapted to support the flexible display from below, to
        a receding position, where said rotating modules are at the closed position, and where said central support plate is disposed under said supporting position to provide a display receiving space disposed directly and immediately above said central support plate for receiving a bent portion of the flexible displays;
    wherein each of said rotating modules includes a moving frame that is movable relative to said base member, and that is adapted for a respective one of the machine bodies to be mounted thereto;
    wherein said moving frame of each of said rotating modules has two moving segments that are respectively connected to opposite ends of said base member in the front-rear direction and that are movable relative to said base member;
    wherein said moving frame of each of said rotating modules further has two shaft members that extend in the front-rear direction; and
    wherein for each of said rotating modules, each of said shaft members extends movably through a respective one of said moving segments of said moving frame and into a respective one of said opposite ends of said base member, and is connected to said central support plate, each of said shaft members being drivable by said respective one of said moving segments to rotate relative to said base member about a shaft rotational axis extending in the front-rear direction so as to drive movement of said central support plate between the supporting position and the receding position.

2. The hinge device as claimed in claim 1, wherein:
    each of said rotating modules further includes
        a side support plate that is connected between said moving frame and said base member, and that is drivable by said moving frame to rotate relative to said base member;
    said side support plates of said rotating modules are disposed respectively on opposite sides of said central support plate in the left-right direction; and
    when said rotating modules are at the open position, the side support plates are adapted to cooperate with said central support plate to support the flexible display, and when said rotating modules are at the closed position, the side support plates are adapted to cooperate with said central support plate to define the display receiving space for receiving the bent portion of the flexible display.

3. The hinge device as claimed in claim 2, wherein said moving frame of each of said rotating modules further has:

a connecting segment that extends in the front-rear direction and that is connected between said moving segments, said side support plate of each of said rotating modules being disposed between said moving segments and being connected to said connecting segment.

4. The hinge device as claimed in claim 3, wherein:
said connecting segment of each of said rotating modules has
  a connecting main body that is connected between said moving segments, and
  at least one torsion unit that is mounted to said connecting main body, and that is connected to said side support plate of a corresponding one of said rotating modules, said at least one torsion unit having
    a housing mounted to said connecting main body,
    a driven member received in said housing, connected to said side support plate, being co-rotatable with said support plate relative to said housing about an axis which extends in the front-rear direction, and having a first concave-convex structure,
    a pressing piece received non-rotatably in said housing, being slidable relative to said housing in the front-rear direction, disposed adjacent to said driven member in the front-rear direction, and having a second concave-convex structure,
    a resilient member received in said housing, and biasing said pressing piece to press against said driven member for maintaining contact between said first and second concave-convex structures; and
  each of said rotating modules is configured to be maintained at at least one predetermined position, where said first and second concave-convex structures are complementary in shape with each other, so as to maintain a corresponding one of said rotating modules at the predetermined position.

5. The hinge device as claimed in claim 4, wherein the at least one predetermined position is one of the open position, the closed position, and a position disposed between the open position and the closed position.

6. The hinge device as claimed in claim 2, wherein:
said side support plate of each of said rotating modules is rotatable relative to said base member about a plate rotational axis;
a distance between the plate rotational axes of said side support plates of said rotating modules is greater than a distance between the shaft rotational axes of said shaft members of said rotating modules; and
when said rotating modules are at the closed position, a width of said display receiving space in the left-right direction increases downwardly.

7. The hinge device as claimed in claim 1, wherein:
each of said shaft members of each of said rotating modules has a driving protrusion that extends in the front-rear direction and that is spaced apart from the shaft rotational axis; and
said central support plate has a plurality of receiving grooves, said driving protrusion of each of said shaft members being engaged movably with a corresponding one of said receiving grooves such that, during rotation of each of said shaft members relative to said base member, said driving protrusion drives the movement of said central support plate between the supporting position and the receding position.

8. The hinge device as claimed in claim 7, wherein:
said base member has two first connecting slots that are disposed respectively proximate to two ends of said central support plate that are opposite to each other in the front-rear direction;
said central support plate has two second connecting slots that are disposed respectively proximate to said two ends of said central support plate in the front-rear direction;
said driving protrusion of each of said shaft members is disposed at one of said two ends of said central support plate, said driving protrusions disposed at each of said two ends of said central support plate being aligned with each other in the left-right direction;
said hinge device further comprises two synchronizing pieces that are arranged in the front-rear direction, and that are disposed respectively proximate to said opposite ends of said central support plate, each of said synchronizing pieces having
  a first connecting portion that extends in the left-right direction, and that is received in a respective one of said first connecting slots of said base member, and
  a second connecting portion that extends in the left-right direction, that is opposite to said first connecting portion in a direction oblique to the front-rear direction, and that is received in a respective one of said second connecting slots of said central support plate such that each of said synchronizing pieces is connected between said central support plate and said base member, each of said synchronizing pieces being slidable in one of said first and second connecting slots in the front-rear direction.

9. The hinge device as claimed in claim 1, wherein:
each of said moving segments of said moving frame of each of said rotating modules has
  a slide slot that extends therethrough in the front-rear direction, that is elongated in the left-right direction, and that has an inner end and an outer end being opposite to each other in the left-right direction, each of said shaft members of each of said rotating modules having a sliding portion that is slidably and non-rotatably received in said slide slot of said respective one of said moving segments, and
  a sliding pole that extends in the front-rear direction, said base member further having a plurality of arc-shaped sliding grooves, said sliding pole being slidably received in a respective one of said arc-shaped sliding grooves; and
when each of said rotating modules is at the open position, said sliding portion of each of said shaft members is disposed in said outer end of said slide slot of a corresponding one of said moving segments, and when each of said rotating modules is at the closed position, said sliding portion of each of said shaft members is disposed in said inner end of said slide slots of a corresponding one of said moving segments.

* * * * *